(12) United States Patent
Im

(10) Patent No.: US 8,063,338 B2
(45) Date of Patent: Nov. 22, 2011

(54) ENHANCING THE WIDTH OF POLYCRYSTALLINE GRAINS WITH MASK

(75) Inventor: James S. Im, New York, NY (US)

(73) Assignee: The Trustees of Columbia in the City of New York, New York, NY (US)

(*) Notice: Subject to any disclaimer, the term of this patent is extended or adjusted under 35 U.S.C. 154(b) by 147 days.

(21) Appl. No.: 12/644,273

(22) Filed: Dec. 22, 2009

(65) Prior Publication Data

US 2010/0099273 A1    Apr. 22, 2010

Related U.S. Application Data

(63) Continuation of application No. 11/373,773, filed on Mar. 10, 2006, now Pat. No. 7,638,728, which is a continuation of application No. PCT/US2004/030326, filed on Sep. 16, 2004.

(60) Provisional application No. 60/503,437, filed on Sep. 16, 2003.

(51) Int. Cl.
H01L 21/84 (2006.01)
H01L 29/04 (2006.01)

(52) U.S. Cl. ............. 219/121.65; 219/121.66; 257/75; 438/487; 430/5; 117/904

(58) Field of Classification Search .......... 219/121.65, 219/121.66; 257/75; 438/487; 430/5; 117/904
See application file for complete search history.

(56) References Cited

U.S. PATENT DOCUMENTS

| | | |
|---|---|---|
| 3,632,205 A | 1/1972 | Marcy |
| 4,234,358 A | 11/1980 | Celler et al. |
| 4,309,225 A | 1/1982 | Fan et al. |
| 4,382,658 A | 5/1983 | Shields et al. |
| 4,456,371 A | 6/1984 | Lin |
| 4,514,895 A | 5/1985 | Nishimura |
| 4,639,277 A | 1/1987 | Hawkins |
| 4,691,983 A | 9/1987 | Kobayashi et al. |
| 4,727,047 A | 2/1988 | Bolzer et al. |
| 4,758,533 A | 7/1988 | Magee et al. |
| 4,793,694 A | 12/1988 | Liu |
| 4,800,179 A | 1/1989 | Mukai |
| 4,855,014 A | 8/1989 | Kakimoto et al. |
| 4,870,031 A | 9/1989 | Suguhara et al. |
| 4,940,505 A | 7/1990 | Schachameyer et al. |
| 4,970,546 A | 11/1990 | Suzuki et al. |
| 4,976,809 A | 12/1990 | Broadbent |
| 4,977,104 A | 12/1990 | Sawada et al. |

(Continued)

FOREIGN PATENT DOCUMENTS

DE    19839718    3/2000

(Continued)

OTHER PUBLICATIONS

U.S. Appl. No. 60/253,256, filed Aug. 31, 2003, Im.

(Continued)

*Primary Examiner* — Samuel M Heinrich

(74) *Attorney, Agent, or Firm* — Baker Botts L.L.P.

(57) ABSTRACT

A system, method and masking arrangement are provided of enhancing the width of polycrystalline grains produced using sequential lateral solidification using a modified mask pattern is disclosed. One exemplary mask pattern employs rows of diamond or circular shaped areas in order to control the width of the grain perpendicular to the direction of primary crystallization.

24 Claims, 5 Drawing Sheets

U.S. PATENT DOCUMENTS

| | | |
|---|---|---|
| 5,032,233 A | 7/1991 | Yu et al. |
| 5,061,655 A | 10/1991 | Ipposhi et al. |
| RE33,836 E | 3/1992 | Resor, III et al. |
| 5,145,808 A | 9/1992 | Sameshima et al. |
| 5,204,659 A | 4/1993 | Sarma |
| 5,233,207 A | 8/1993 | Anzai |
| 5,285,236 A | 2/1994 | Jain |
| 5,291,240 A | 3/1994 | Jain |
| 5,304,357 A | 4/1994 | Sato et al. |
| 5,373,803 A | 12/1994 | Noguchi et al. |
| 5,395,481 A | 3/1995 | McCarthy |
| 5,409,867 A | 4/1995 | Asano |
| 5,413,958 A | 5/1995 | Imahashi et al. |
| 5,417,897 A | 5/1995 | Asakawa et al. |
| 5,436,095 A | 7/1995 | Mizuno et al. |
| 5,453,594 A | 9/1995 | Konecny |
| 5,456,763 A | 10/1995 | Kaschmitter et al. |
| 5,466,908 A | 11/1995 | Hosoya et al. |
| 5,496,768 A | 3/1996 | Kudo |
| 5,512,494 A | 4/1996 | Tanabe |
| 5,523,193 A | 6/1996 | Nelson |
| 5,529,951 A | 6/1996 | Noguchi et al. |
| 5,534,716 A | 7/1996 | Takemura |
| 5,591,668 A | 1/1997 | Maegawa et al. |
| 5,614,421 A | 3/1997 | Yang |
| 5,614,426 A | 3/1997 | Funada et al. |
| 5,616,506 A | 4/1997 | Takemura |
| 5,620,910 A | 4/1997 | Teramoto |
| 5,683,935 A * | 11/1997 | Miyamoto et al. ............... 117/8 |
| 5,696,388 A | 12/1997 | Funada et al. |
| 5,710,050 A | 1/1998 | Makita et al. |
| 5,721,606 A | 2/1998 | Jain |
| 5,736,709 A | 4/1998 | Neiheisel |
| 5,742,426 A | 4/1998 | York |
| 5,756,364 A | 5/1998 | Tanaka et al. |
| 5,766,989 A | 6/1998 | Maegawa et al. |
| 5,844,588 A | 12/1998 | Anderson |
| 5,861,991 A | 1/1999 | Fork |
| 5,893,990 A | 4/1999 | Tanaka |
| 5,981,974 A | 11/1999 | Makita |
| 5,986,807 A | 11/1999 | Fork |
| 6,014,944 A | 1/2000 | Russell et al. |
| 6,072,631 A | 6/2000 | Guenther et al. |
| 6,081,381 A | 6/2000 | Shalapenok et al. |
| 6,093,934 A | 7/2000 | Yamazaki et al. |
| 6,117,301 A | 9/2000 | Freudenberger et al. |
| 6,117,752 A | 9/2000 | Suzuki |
| 6,120,976 A | 9/2000 | Treadwell et al. |
| 6,130,009 A | 10/2000 | Smith et al. |
| 6,130,455 A | 10/2000 | Yoshinouchi |
| 6,156,997 A | 12/2000 | Yamazaki et al. |
| 6,162,711 A | 12/2000 | Ma et al. |
| 6,169,014 B1 | 1/2001 | McCulloch |
| 6,172,820 B1 | 1/2001 | Kuwahara |
| 6,177,301 B1 | 1/2001 | Jung |
| 6,187,088 B1 | 2/2001 | Okumura |
| 6,190,985 B1 | 2/2001 | Buynoski |
| 6,193,796 B1 | 2/2001 | Yang |
| 6,198,141 B1 | 3/2001 | Yamazaki et al. |
| 6,203,952 B1 | 3/2001 | O'Brien et al. |
| 6,222,195 B1 | 4/2001 | Yamada et al. |
| 6,235,614 B1 | 5/2001 | Yang |
| 6,242,291 B1 | 6/2001 | Kusumoto et al. |
| 6,255,146 B1 | 7/2001 | Shimizu et al. |
| 6,274,488 B1 | 8/2001 | Talwar et al. |
| 6,285,001 B1 | 9/2001 | Fleming et al. |
| 6,300,175 B1 | 10/2001 | Moon |
| 6,313,435 B1 | 11/2001 | Shoemaker et al. |
| 6,316,338 B1 | 11/2001 | Jung |
| 6,320,227 B1 | 11/2001 | Lee et al. |
| 6,322,625 B2 | 11/2001 | Im |
| 6,326,286 B1 | 12/2001 | Park et al. |
| 6,333,232 B1 | 12/2001 | Kunikiyo |
| 6,341,042 B1 | 1/2002 | Matsunaka et al. |
| 6,348,990 B1 | 2/2002 | Igasaki et al. |
| 6,353,218 B1 | 3/2002 | Yamazaki et al. |
| 6,358,784 B1 | 3/2002 | Zhang et al. |
| 6,368,945 B1 | 4/2002 | Im |
| 6,388,146 B1 | 5/2002 | Onishi et al. |
| 6,388,386 B1 | 5/2002 | Kunii et al. |
| 6,392,810 B1 | 5/2002 | Tanaka |
| 6,393,042 B1 | 5/2002 | Tanaka |
| 6,407,012 B1 | 6/2002 | Miyasaka et al. |
| 6,410,373 B1 | 6/2002 | Chang et al. |
| 6,429,100 B2 | 8/2002 | Yoneda |
| 6,432,758 B1 | 8/2002 | Cheng et al. |
| 6,444,506 B1 | 9/2002 | Kusumoto et al. |
| 6,445,359 B1 | 9/2002 | Ho |
| 6,448,612 B1 | 9/2002 | Miyazaki et al. |
| 6,451,631 B1 | 9/2002 | Grigoropoulos et al. |
| 6,455,359 B1 | 9/2002 | Yamazaki et al. |
| 6,468,845 B1 | 10/2002 | Nakajima et al. |
| 6,471,772 B1 | 10/2002 | Tanaka |
| 6,472,684 B1 | 10/2002 | Yamazaki et al. |
| 6,476,447 B1 | 11/2002 | Yamazaki et al. |
| 6,482,722 B2 | 11/2002 | Kunii et al. |
| 6,493,042 B1 | 12/2002 | Bozdagi et al. |
| 6,495,067 B1 | 12/2002 | Ono |
| 6,495,405 B2 | 12/2002 | Voutsas et al. |
| 6,501,095 B2 | 12/2002 | Yamaguchi et al. |
| 6,506,636 B2 | 1/2003 | Yamazaki et al. |
| 6,511,718 B1 | 1/2003 | Paz de Araujo et al. |
| 6,512,634 B2 | 1/2003 | Tanaka |
| 6,516,009 B1 | 2/2003 | Tanaka |
| 6,521,473 B1 | 2/2003 | Jung |
| 6,521,492 B2 | 2/2003 | Miyasaka et al. |
| 6,526,585 B1 | 3/2003 | Hill |
| 6,528,359 B2 | 3/2003 | Kusumoto et al. |
| 6,535,535 B1 | 3/2003 | Yamazaki et al. |
| 6,555,449 B1 | 4/2003 | Im et al. |
| 6,562,701 B2 | 5/2003 | Ishida et al. |
| 6,563,077 B2 | 5/2003 | Im |
| 6,573,163 B2 | 6/2003 | Voutsas et al. |
| 6,573,531 B1 | 6/2003 | Im et al. |
| 6,577,380 B1 | 6/2003 | Farmiga et al. |
| 6,582,827 B1 | 6/2003 | Im |
| 6,590,228 B2 | 7/2003 | Voutsas et al. |
| 6,599,790 B1 | 7/2003 | Yamazaki et al. |
| 6,608,326 B1 | 8/2003 | Shinagawa et al. |
| 6,621,044 B2 | 9/2003 | Jain et al. |
| 6,635,554 B1 | 10/2003 | Im et al. |
| 6,635,932 B2 | 10/2003 | Grigoropoulos et al. |
| 6,660,575 B1 | 12/2003 | Zhang |
| 6,667,198 B2 | 12/2003 | Shimoto et al. |
| 6,693,258 B2 | 2/2004 | Sugano et al. |
| 6,734,635 B2 | 5/2004 | Kunii et al. |
| 6,744,069 B1 | 6/2004 | Yamazaki et al. |
| 6,746,942 B2 | 6/2004 | Sato et al. |
| 6,767,804 B2 | 7/2004 | Crowder |
| 6,770,545 B2 | 8/2004 | Yang |
| 6,777,276 B2 | 8/2004 | Crowder et al. |
| 6,784,455 B2 | 8/2004 | Maekawa et al. |
| 6,830,993 B1 | 12/2004 | Im et al. |
| 6,858,477 B2 | 2/2005 | Deane et al. |
| 6,908,835 B2 | 6/2005 | Sposili et al. |
| 6,961,117 B2 | 11/2005 | Im |
| 7,029,996 B2 | 4/2006 | Im et al. |
| 7,049,184 B2 | 5/2006 | Tanabe |
| 7,091,411 B2 | 8/2006 | Falk et al. |
| 7,187,016 B2 | 3/2007 | Arima |
| 7,192,479 B2 * | 3/2007 | Mitani et al. ............... 117/2 |
| 7,217,605 B2 | 5/2007 | Kawasaki et al. |
| 7,259,081 B2 | 8/2007 | Im |
| 7,297,982 B2 | 11/2007 | Suzuki et al. |
| 7,300,858 B2 | 11/2007 | Im |
| 7,311,778 B2 | 12/2007 | Im et al. |
| 7,319,056 B2 | 1/2008 | Im et al. |
| 7,341,928 B2 | 3/2008 | Im |
| 7,638,728 B2 | 12/2009 | Im |
| 7,679,028 B2 | 3/2010 | Im et al. |
| 7,804,647 B2 * | 9/2010 | Mitani et al. ............... 359/569 |
| 2001/0001745 A1 | 5/2001 | Im et al. |
| 2001/0041426 A1 | 11/2001 | Im |
| 2002/0083557 A1 | 7/2002 | Jung |
| 2002/0096680 A1 | 7/2002 | Sugano et al. |
| 2002/0104750 A1 | 8/2002 | Ito |
| 2002/0119609 A1 | 8/2002 | Hatano et al. |

| | | | |
|---|---|---|---|
| 2002/0151115 A1 | 10/2002 | Nakajima et al. |
| 2003/0000455 A1 | 1/2003 | Voutsas |
| 2003/0003242 A1 | 1/2003 | Voutsas |
| 2003/0006221 A1 | 1/2003 | Hong et al. |
| 2003/0013278 A1 | 1/2003 | Jang et al. |
| 2003/0014337 A1 | 1/2003 | Mathews et al. |
| 2003/0029212 A1 | 2/2003 | Im |
| 2003/0068836 A1 | 4/2003 | Hongo et al. |
| 2003/0088848 A1 | 5/2003 | Crowder |
| 2003/0089907 A1 | 5/2003 | Yamaguchi et al. |
| 2003/0096489 A1 | 5/2003 | Im et al. |
| 2003/0119286 A1 | 6/2003 | Im et al. |
| 2003/0148565 A1 | 8/2003 | Yamanaka |
| 2003/0194613 A1 | 10/2003 | Voutsas et al. |
| 2003/0196589 A1 | 10/2003 | Mitani et al. |
| 2004/0053450 A1 | 3/2004 | Sposili et al. |
| 2004/0061843 A1 | 4/2004 | Im |
| 2004/0127066 A1 | 7/2004 | Jung |
| 2004/0140470 A1 | 7/2004 | Kawasaki et al. |
| 2004/0169176 A1 | 9/2004 | Peterson et al. |
| 2004/0182838 A1 | 9/2004 | Das et al. |
| 2004/0222187 A1 | 11/2004 | Lin |
| 2004/0224487 A1 | 11/2004 | Yang |
| 2005/0032249 A1 | 2/2005 | Im et al. |
| 2005/0034653 A1 | 2/2005 | Im et al. |
| 2005/0059265 A1 | 3/2005 | Im |
| 2005/0141580 A1 | 6/2005 | Partlo et al. |
| 2005/0142450 A1 | 6/2005 | Jung |
| 2005/0142451 A1 | 6/2005 | You |
| 2005/0202654 A1 | 9/2005 | Im |
| 2006/0030164 A1 | 2/2006 | Im |
| 2006/0102901 A1 | 5/2006 | Im et al. |
| 2006/0125741 A1 | 6/2006 | Tanaka et al. |
| 2006/0211183 A1 | 9/2006 | Duan et al. |
| 2006/0254500 A1 | 11/2006 | Im et al. |
| 2007/0007242 A1 | 1/2007 | Im |
| 2007/0020942 A1 | 1/2007 | Im |
| 2007/0032096 A1 | 2/2007 | Im |
| 2007/0108472 A1 | 5/2007 | Jeong et al. |
| 2007/0111349 A1 | 5/2007 | Im |
| 2007/0215942 A1 | 9/2007 | Chen et al. |

FOREIGN PATENT DOCUMENTS

| | | |
|---|---|---|
| DE | 10103670 | 8/2002 |
| EP | 681316 | 8/1995 |
| EP | 655774 | 7/1996 |
| EP | 1067593 | 10/2001 |
| EP | 04/030328 | 9/2004 |
| GB | 2338342 | 12/1999 |
| GB | 2338343 | 12/1999 |
| GB | 2338597 | 12/1999 |
| JP | 62181419 | 8/1987 |
| JP | 2283036 | 11/1990 |
| JP | 04033327 | 2/1992 |
| JP | 4279064 | 10/1992 |
| JP | 6252048 | 9/1994 |
| JP | 6283422 | 10/1994 |
| JP | 7176757 | 7/1995 |
| JP | 11064883 | 3/1999 |
| JP | 11281997 | 10/1999 |
| JP | 2001023920 | 1/2001 |
| JP | 523723/2003 | 8/2005 |
| WO | 9745827 | 12/1997 |
| WO | 9824118 | 6/1998 |
| WO | 9931719 | 6/1999 |
| WO | 0014784 | 3/2000 |
| WO | 0118854 | 3/2001 |
| WO | 0118855 | 3/2001 |
| WO | 0171786 | 9/2001 |
| WO | WO0171791 | 9/2001 |
| WO | 0231869 | 4/2002 |
| WO | 02/42847 | 5/2002 |
| WO | 0242847 | 5/2002 |
| WO | 0286954 | 5/2002 |
| WO | 02086955 | 10/2002 |
| WO | 03/018882 | 3/2003 |
| WO | 03018882 | 3/2003 |
| WO | 03046965 | 6/2003 |
| WO | 03084688 | 10/2003 |
| WO | 2004/017382 | 2/2004 |
| WO | 2004017379 | 2/2004 |
| WO | 2004017380 | 2/2004 |
| WO | 2004017381 | 2/2004 |
| WO | 2004017382 | 2/2004 |
| WO | 2004075263 | 9/2004 |
| WO | 2004/075263 | 1/2005 |
| WO | 2005/029548 | 3/2005 |
| WO | 2005/029549 | 3/2005 |
| WO | WO2005029546 | 3/2005 |
| WO | WO2005029548 | 3/2005 |
| WO | WO2005029550 | 3/2005 |
| WO | WO2005029551 | 3/2005 |

OTHER PUBLICATIONS

Im et al., "Controlled Super-Lateral Growth of Si Films for Microstructural Manipulation and Optimization", Phys. Stat. Sol. (a), vol. 166, p. 603 (1998).

S.D. Brotherton et al., "Influence of Melt Depth in Laser Crystallized Poly-Si Thin Film Transistors," 82 J. Appl. Phys. 4086 (1997).

J.S. Im et al., "Crystalline Si Films for Integrated Active-Matrix Liquid-Crystals Displays," 21 MRS Bulletin 39 (1996).

Im et al., "Single-Crystal Si Films for Thin-Film Transistor Devices," Appl. Phys. Lett., vol. 70 (25), p. 3434 (1997).

Sposili et al., "Sequential Lateral Solidification of Thin Silicon Films on SiO2", Appl, Phys. Lett., vol. 69 (19), p. 2864 (1996).

Crowder et al., "Low-Temperature Single-Crystal Si TFT's Fabricated on Si Films processed via Sequential Lateral Solidification", IEEE Electron Device Letter, vol. 19 (8), p. 306 (1998).

Sposili et al., "Single-Crystal Si Films via a Low-Substrate-Temperature Excimer-Laser Crystallization Method", Mat. Res. Soc. Symp. Proc. vol. 452, pp. 953-958, 1997 Materials Reasearch Society.

C. E. Nebel, "Laser Interference Structuring of A-SI:h" Amorphous Silicon Technology—1996, San Francisco, CA Apr. 8-12, 1996, Materials Research Society Symposium Proceedings, vol. 420, Pittsburgh, PA.

J. H. Jeon et al., "Two-step laser recrystallization of poly-Si for effective control of grain boundaries", Journal of Non Crystalline Solids, North-Holland Publishing Company, NL, vol. 266-269, May 2000, pp. 645-649.

H. Endert et al., "Excimer Laser: A New Tool for Precision Micromaching," 27 Optical and Quantum Electronics, 1319 (1995).

"Overview of Beam Delivery Systems for Excimer Lasers," Micro/Las Lasersystem GMBH, 1999.

K.H. Weiner et al., "Ultrashallow Junction Formation Using Projection Gas Immersion Laser Doping (PGILD)," A Verdant Technologies Technical Brief, Aug. 20, 1997.

Hau-Riege C.S. et al., "The Effects Microstructural Transitions at Width Transitions on interconnect reliability," Journal of Applied Physics, Jun. 15, 2000, vol. 87, No. 12, pp. 8467-8472.

McWilliams et al., "Wafer-Scale Laser Pantography: Fabrication of N-Metal-Oxide-Semiconductor Transistors and Small-Scale Integrated Circuits by Direct-Write Laser-Induced Pyrolytic Reactions," Applied Physics Letters, American Institute of Physics, New York, US, vol. 43, No. 10, Nov. 1983, pp. 946-948.

Mariucci et al., "Grain boundary location control by patterned metal film in excimer laser crystallized polysilicon," Proceedings of the Figth International COnference on Polycrystalline Semiconductors, Schwabisch Gmund, Germany, Sep. 13-18, 1998, vol. 67-68, pp. 175-180.

Broadbent et al., "Excimer Laser Processing of Al-1%Cu/TiW Interconnect Layers," 1989 Proceedings, Sixth International IEEE VLSI Multilevel Interconnection COnference, Santa Clara, CA, Jun. 12-13, 1989, pp. 336-345.

H.J. Kim and James S. Im, "Grain Boundary Location-Controlled Poly-Si Films for TFT Devices Obtained Via Novel Excimer Laser Process," Abstracts for Symposium of Materials Research Society, Nov. 27 to Dec. 2, 1994, p. 230.

S.D. Brotherton, "Polycrystalline Silicon Thin Film Transistors," 10 Semicond. Sci. Tech., pp. 721-738 (1995).

H. Watanabe et al., "Crystallization Process of Polycrystalline Silicon by KrF Excimer Laser Annealing," 33 Japanese J. of Applied Physics Part 1—Regular Papers Short Notes & Review Papers, pp. 4491-4498 (1994).

E. Fogarassy et al., "Pulsed Laser Crystallization of Hydrogen-Free a-Si Thin Films for High-Mobility Poly-Si TFT Fabrication," 56 Applied Physics A—Solids and Surfaces, pp. 365-373 (1993).

Y. Miyata et al, "Low-Temperature Polycrystalline Silicon Thin-Film Transistors for Large-Area Liquid Crystal Display," 31 Japanese J. of Applied Physics Part 1—Regular Papers Short Notes & Review Papers, pp. 4559-4562 (1992).

Im et al., "Phase Transformation Mechanisms Involved in Excimer Laser Crystallization of Amorphous Silicon Films," Appl. Phys. Lett., vol. 63 (14), p. 1969 (1993).

Im et al., "On the Super Lateral Growth Phenomenon Observed in Excimer Laser-Induced Crystallization of Thin Si Films," Appl. Phys. Lett., vol. 64 (17), p. 2303 (1994).

Brochure from MicroLas Lasersystem, GmbH, "UV Optics Systems for Excimer Laser Based Micromaching and Marking". 1999.

Ishida et al., "Ultra-shallow boxlike profiles fabricated by pulsed ultraviolet-laser doping process", J. Vac. Sci. Technol. B 12(1), p. 399-403, 1994. (No month).

Yoshimoto, et al., "Excimer-Laser-Produced and Two-Dimensionally Position-Controlled Giant Si Grains on Organic SOG Underlayer", p. 285-286, AM-LCD 2000. No month.

Ozawa et al., "Two-Dimensionally Position-Controlled Exicer-Laser-Crystallization of Silicon Thin Films on Glassy Substrate", Jpn. J. Appl. Phys. vol. 38, Part 1, No. 10, p. 5700-5705, (1999). No month.

I.W. Boyd, Laser Processing of Thin Films and Microstructures, Oxidation, Deposition, and Etching of Insulators (Springer—Verlag Berlin Heidelber 1987).

N. Yamamuchi and R. Reif, Journal of Applied Physics, "Polycrystalline silicon thin films processed with silicon ion implantation and subsequent solid-phase crystallization: Theory, experiments, and thin-film transistor applications"—Apr. 1, 1994—vol. 75, Issue 7, pp. 3235-3257.

T. Noguchi, "Appearance of Single-Crystalline Properties in Fine-Patterned Si Thin Film Transistors (TFTs) by Solid Phase Crystallization (SPC)," Jpn. J. Appl. Phys. vol. 32 (1993) L1584-L1587.

Ishihara et al., "A Novel Double-Pulse Exicem-Laser Crystallization Method of Silicon Thin-Films," Japanese Journal of Applied Physics, Publication Office Japanese Journal of Applied Physics, Tokyo, Japan, vol. 34, No. 8A, Aug. 1995, pp. 3976-3981.

Kim, H. J., "Excimer-Laser-Induced Crystallization of Amorophus Silicon Thin Films", Ph. D. Dissertation Abstract, Columbia University, 1996.

Bergmann, R. et al., Nucleation and Growth of Crystalline Silicon Films on Glass for Solar Cells, Phys. Stat. Sol., 1998, pp. 587-602, vol. 166, Germany.

Biegelsen, D.K., L.E. Fennell and J.C. Zesch, Origin of oriented crystal growth of radiantly melted silicon on SiO/sub 2, Appl. Phys. Lett. 45, 546 (1984).

Boyd, Laser Processing of Thin Films and Microstructures, Oxidation, Deposition, and Etching of Insulators (Springer—Verlag Berlin Heidelber 1987).

Brotherton, S.D., et al., Characterisation of poly-Si TFTs in Directionally Solidified SLS Si, Asia Display/IDS'01, p. 387-390.

Crowder et al., "Parametric investigation of SLS-processed polysilicon thin films for TFT application," Preparations and Characterization, Elsevier, Sequoia, NL, vol. 427, No. 1-2, Mar. 3, 2003, pp. 101-107, XP004417451.

Crowder et al., "Sequential Lateral Solidification of PECVD and Sputter Deposited a-Si Films", Mat. Res. Soc. Symp. Proc. 621:Q9. 7.1-9.7.6, 2000.

Dassow, R. et al. Laser-Crystallized Polycrystalline Silicon on Glass for Photovoltaic Applications, Solid State Phenomena, pp. 193-198, vols. 67-68, Scitec Publications, Switzerland.

Dassow, R. et al. Nd:YVO4 Laser Crystallization for Thin Film Transistors with a High Mobility, Mat. Res. Soc. Symp. Proc., 2000, Q9.3.1-Q9.3.6, vol. 621, Materials Research Society.

Dassow, R. et al., Laser crystallization of silicon for high-performance thin-film transistors, Semicond. Sci. Technol., 2000, pp. L31-L34, vol. 15, UK.

Dimitriadis, C.A., J. Stoemenos, P.A. Coxon, S. Friligkos, J. Antonopoulos and N.A. Economou, Effect of pressure on the growth of crystallites of low-pressure chemical-vapor-deposited polycrystalline silicon films and the effective electron mobility under high normal field in thin-film transistors, J. Appl. Phys. 73, 8402 (1993).

Geis et al., "Crystallographic orientation of silicon on an amorphous substrate using an artificial surface-relief grating and laser crystallization," Appl. Phys. Lett. 35(1) Jul. 1, 1979, 71-74.

Geis et al., "Silicon graphoepitaxy using a strip-heater oven," Appl. Phys. Lett. 37(5), Sep. 1, 1980, 454-456.

Geis et al., "Zone-Melting recrystallization of SI Films with a moveable-strip heater oven" J. Electro-Chem. Soc., 129: 2812 (1982).

Gupta et al., "Numerical Analysis of Excimer-laser induced melting and solidification of Si Thin Films", Applied Phys. Lett., 71:99, 1997.

Hau-Reige et al., "Microstructural Evolution Induced By Scanned Laser Annealing in Al Interconnects," Appl. Phys. Lett., vol. 75, No. 10, p. 1464-1466, 1999.

Hawkins, W.G. et al., "Origin of lamellae in radiatively melted silicon films," appl. Phys. Lett. 42(4), Feb. 15, 1983.

Hayzelden, C. and J.L. Batstone, Silicide formation and silicide-mediated crystallization of nickel-implanted amorphous silicon thin films, J. Appl. Phys. 73, 8279 (1993).

Im, J.S., Method and system for producing crystalline thin films with a uniform crystalline orientation, U.S. Appl. No. 60/503,419; ref. file # 36013(BB); Columbia ref. M02-063.

Jung, Y.H., et al., Low Temperature Polycrystalline Si TFTs Fabricated with Directionally Crystallized Si Film, Mat. Res. Soc. Symp. Proc. vol. 621, Z8.3.1-6, 2000.

Jung, Y.H., et al., The Dependence of Poly-Si TFT Characteristics on the Relative Misorientation Between Grain Boundaries and the Active Channel, Mat. Res. Soc. Symp. Proc. vol. 621, Q9.14.1-6, 2000.

Kahlert, H., "Creating Crystals", OE Magazine, Nov. 2001, 33-35.

Kim, C. et al., Development of SLS-Based SOG Display, IDMC 2005, Thu-15-02, 252-255.

Kim, H. J. et al., "Excimer Laser Induced Crystallization of Thin Amorphous Si Films on SiO2: Implications of Crystallized Microstructures for Phase Transformation Mechanisms," Mat. Res. Soc. Symp. Proc., vol. 283, 1993.

Kim, H.J. et al., "New Excimer-laser-crystallization method for producing large-grained and grain boundary-location-controlled Si Films for Thin Film Transistors", Applied Phys. Lett., 68: 1513.

Kim, H.J. et al., "Multiple Pulse Irradiation Effects in Excimer Laser-Induced Crystallization of Amorphous Si Films," Mat. Res. Soc. Sym. Proc., 321:665-670 (1994).

Kim, H.-J., et al., "The effects of dopants on surface-energy-driven secondary grain growth in silicon films," J. Appl. Phys. 67 (2), Jan. 15, 1990.

Kimura, M. and K. Egami, Influence of as-deposited film structure on (100) texture in laser-recrystallized silicon on fused quartz, Appl. Phys. Lett. 44, 420 (1984).

Knowles, D.S. et al., "P-59: Thin Beam Crystallization Method: a New Laser Annealing Tool with Lower Cost and Higher Yield for LTPS Panels," SID 00 Digest, pp. 1-3 , 2005.

Kohler, J.R. et al., Large-grained polycrystalline silicon on glass by copper vapor laser annealing. Thin Solid Films, 1999, pp. 129-132, vol. 337, Elsevier.

Kung, K.T.Y. and R. Reif, Implant-dose dependence of grain size and (110) texture enhancements in polycrystalline Si films by seed selection through ion channeling, J. Appl. Phys. 59, 2422 (1986).

Kung, K.T.Y., R.B. Iverson and R. Reif, Seed selection through ion channeling to modify crystallographic orientations of polycrystalline Si films on SiO/sub 2/:Implant angle dependence, Appl. Phys. Lett. 46, 683 (1985).

Kuriyama, H., T. Nohda, S. Ishida, T. Kuwahara, S. Noguchi, S. Kiyama, S. Tsuda and S. Nakano, Lateral grain growth of poly-Si films with a specific orientation by an excimer laser annealing method, Jpn. J. Appl. Phys. 32, 6190 (1993).

Kuriyama, H., T. Nohda, Y. Aya, T. Kuwahara, K. Wakisaka, S. Kiyama and S. Tsuda, Comprehensive study of lateral grain growth in poly-Si films by excimer laser annealing and its application to thin film transistors, Jpn. J. Appl. Phys. 33, 5657 (1994).

Lee, S.-W. and S.-K. Joo, Low temperature poly-Si thin-film transistor fabrication by metal-induced lateral crystallization, IEEE Electron Device Letters 17, 160 (1996).

Lee, S.-W., Y.-C. Jeon and S.-K. Joo, Pd induced lateral crystallization of amorphous Si thin films, Appl. Phys. Lett. 66, 1671 (1995).
Leonard, J.P. et al, "Stochastic modeling of solid nucleation in super-cooled liquids", Appl. Phys. Lett. 78:22, May 28, 2001, 3454-3456.
Limanov, A. et al., Single-Axis Projection Scheme for Conducting Sequential Lateral Solidification of Si Films for Large-Area Electronics, Mat. Res. Soc. Symp. Proc., 2001, D10.1.1-D10.1.7, vol. 685E, Materials Research Society.
Limanov, A. et al., The Study of Silicon Films Obtained by Sequential Lateral Solidification by Means of a 3-k-Hz Excimer Laser with a Sheetlike Beam, Russian Microelectronics, 1999, pp. 30-39, vol. 28, No. 1, Russia.
Limanov, A.B., et al., Development of Linear Sequential Lateral Solidification Technique to Fabricate Quasi-Single-Cyrstal Superthin Si Films for High-Performance Thin Film Transistor Devices, Perspectives, Science, and Technologies for Novel Silicon on.
Mariucci et al., "Advanced excimer laser crystallization techniques," Thin Solid Films, vol. 338, pp. 39-44, 2001.
Micro/Las Lasersystem, GmbH, "UV Optics Systems for Excimer Laser Based Micromaching and Marking" (1999).
Miyasaka, M., K. Makihira, T. Asano, E. Polychroniadis and J. Stoemenos, In situ observation of nickel metal-induced lateral crystallization of amorphous silicon thin films, Appl. Phys. Lett. 80, 944 (2002).
Nerding, M., S. Christiansen, R. Dassow, K. Taretto, J.R. Kohler and H.P. Strunk, Tailoring texture in laser crystallization of silicon thin-films on glass, Solid State Phenom. 93, 173 (2003).
Sato et al., "Mobility anisotropy of electrons in inversion layers on oxidized silicon surfaces" Physical Review B (State State) 4, 1950 (1971).
Smith, H.I. et al., "The Mechanism of Orientation in Si Graphoepitaxy by Laser or Strip Heater Recrystallization," J. Electrochem. Soc.: Solid-State Science and Technology, Taiwan FPD, Jun. 11, 2005, pp. 1-12.
Song et al., "Single Crystal Si Islands on SiO2 Obtained Via Excimer Laser Irradiation of a Patterned Si Film", Applied Phys. Lett., 68:3165, 1996.
Sposili et al., "Line-scan sequential lateral solidification of Si thin films", Appl. Phys. A67, 273-6, 1998.
Thompson, C.V. and H.I. Smith, Surface-energy-driven secondary grain growth in ultrathin (<100 nm) films of silicon, Appl. Phys. Lett. 44, 603 (1984).
van der Wilt, "The Commercialization of the SLS Technology," Taiwan FPD, Jun. 11, 2004, pp. 1-12.
Van Der Wilt, P.C., "State-of-the-Art Laser Crystallization of Si for Flat Panel Displays," PhAST, May 18, 2004, pp. 1-34.
Van Der Wilt, P.C., "Textured poly-Si films for hybrid SLS," Jul. 2004, pp. 1-5.
Voutsas, A. T., "Assessment of the Performance of Laser-Based Lateral-Crystallization Technology via Analysis and Modeling of Polysilicon Thin-Film-Transistor Mobility," IEEE Transactions on Electronic Devices, vol. 50, No. 6, Jun. 2003.
Voutsas, A.T., A new era of crystallization: advances in polysilicon crystallization and crystal engineering, Applied Surface Science 250-262, 2003.
Voutsas, A.T., et al., Effect of process parameters on the structural characteristics of laterally grown, laser-annealed polycrystalline silicon films, Journal of Applied Physics, vol. 94, No. 12, p. 7445-7452, Dec. 15, 2003.
Weiner, K. H. et al. "Laser-assisted, Self-aligned Silicide Formation," A Verdant Technologies technical brief, Aug. 7, 1997, 1-9.
Werner, J.H., et al. From polycrystalline to single crystalline silicon on glass, Thin Solid Films 383, 95-100, 2001.
White et al., "Characterization of thin-oxide MNOS memory transistors" IEEE Trans. Electron Devices ED-19, 1280 (1972).
U.S. Appl. No. 10/308,958 (Abandoned), filed Dec. 3, 2002.
U.S. Appl. No. 12/402,208, filed Mar. 11, 2009.
U.S. Appl. No. 12/419,821, filed Apr. 7, 2009.
U.S. Appl. No. 12/567,414, filed Sep. 25, 2009.
U.S. Appl. No. 09/390,535, Nov. 13, 2002 Amendment after Notice of allowance.
U.S. Appl. No. 09/390,535, Oct. 28, 2002 Issue Fee Payment.
U.S. Appl. No. 09/390,535, Oct. 23, 2002 Notice of Allowance.
U.S. Appl. No. 09/390,535, Aug. 26, 2002 Reponse to Non-Final Office Action.
U.S. Appl. No. 09/390,535, May 20, 2002 Non-Final Office Action.
U.S. Appl. No. 09/390,535, Apr. 4, 2002 Response to Non-Final Office Action.
U.S. Appl. No. 09/390,535, Nov. 2, 2001 Non-Final Office Action.
U.S. Appl. No. 09/390,535, Sep. 15, 2001 Response to Non-Final Office Action.
U.S. Appl. No. 09/390,535, Jul. 10, 2001 Non-Final Office Action.
U.S. Appl. No. 09/390,535, Jun. 18, 2001 Response to Final Office Action.
U.S. Appl. No. 09/390,535, Apr. 3, 2001 Final Office Action.
U.S. Appl. No. 09/390,535, Mar. 2, 2001 Response to Non-Final Office Action.
U.S. Appl. No. 09/390,535, Oct. 17, 2000 Non-Final Office Action.
U.S. Appl. No. 10/294,001, Feb. 13, 2006 Issue Fee payment.
U.S. Appl. No. 10/294,001, Jan. 27, 2006 Notice of Allowance.
U.S. Appl. No. 10/294,001, Nov. 10, 2005 Reponse to Non-Final Office Action.
U.S. Appl. No. 10/294,001, May 19, 2005 Non-Final Office Action.
U.S. Appl. No. 10/294,001, Feb. 16, 2005 Response to Restriction Requirement.
U.S. Appl. No. 10/294,001, Jan. 14, 2005 Restriction Requirement.
U.S. Appl. No. 10/294,001, Oct. 18, 2004 Response to Non-Final Office Action.
U.S. Appl. No. 10/294,001, Jul. 13, 2004 Non-Final Office Action.
U.S. Appl. No. 10/308,958, Mar. 14, 2005 Notice of Abandonment.
U.S. Appl. No. 10/308,958, Mar. 2, 2005 Notice of Allowance.
U.S. Appl. No. 10/308,958, Feb. 25, 2005 Express Abandonment.
U.S. Appl. No. 10/308,958, Dec. 3, 2004 Response to Non-Final Office Action.
U.S. Appl. No. 10/308,958, Sep. 22, 2004 Non-Final Office Action.
U.S. Appl. No. 10/308,958, May 20, 2004 Supplemental Amendment.
U.S. Appl. No. 10/308,958, May 19, 2004 Examiner's Interview Summary.
U.S. Appl. No. 10/308,958, Dec. 29, 2003 Examiner's Interview Summary.
U.S. Appl. No. 10/308,958, Oct. 9, 2003 Terminal Disclaimer filed.
U.S. Appl. No. 10/308,958, Sep. 22, 2003 Response to Non-Final Office Action.
U.S. Appl. No. 10/308,958, Jun. 17, 2003 Non-Final Office Action.
U.S. Appl. No. 11/141,815, Nov. 21, 2007 Issue Fee payment.
U.S. Appl. No. 11/141,815, Oct. 17, 2007 Notice of Allowance.
U.S. Appl. No. 11/141,815, Oct. 1, 2007 Response to Non-Final Office Action and Terminal Disclaimer filed.
U.S. Appl. No. 11/141,815, Jun. 1, 2007 Non-Final Office Action.
U.S. Appl. No. 11/373,773, Nov. 10, 2009 Issue Fee payment.
U.S. Appl. No. 11/373,773, Aug. 11, 2009 Notice of Allowance.
U.S. Appl. No. 11/373,773, May 5, 2009 Response to Non-Final Office Action.
U.S. Appl. No. 11/373,773, Dec. 5, 2008 Non-Final Office Action.
U.S. Appl. No. 11/744,493, Nov. 10, 2009 Issue Fee payment.
U.S. Appl. No. 11/744,493, Aug. 10, 2009 Notice of Allowance.
U.S. Appl. No. 11/744,493, Jun. 24, 2009 Request for Continued Examination (RCE).
U.S. Appl. No. 11/744,493, Mar. 27, 2009 Notice of Allowance.
U.S. Appl. No. 11/744,493, Dec. 23, 2008 Terminal Disclaimer filed.
U.S. Appl. No. 11/744,493, Sep. 23, 2008 Non-Final Office Action.
U.S. Appl. No. 12/402,208, Feb. 23, 2011 Final Office Action.
U.S. Appl. No. 12/402,208, Nov. 29, 2010 Response to Non-Final Office Action.
U.S. Appl. No. 12/402,208, Jun. 28, 2010 Non-Final Office Action.
U.S. Appl. No. 12/419,821, Mar. 22, 2011 Non-Final Office Action.
U.S. Appl. No. 12/567,414, Jun. 1, 2011 Restriction Requirement.

* cited by examiner

ENHANCING THE WIDTH OF POLYCRYSTALLINE GRAINS WITH MASK

CROSS-REFERENCE TO RELATED APPLICATIONS

This application is a continuation of U.S. application Ser. No. 11/373,773, filed Mar. 10, 2006 now U.S. Pat. No. 7,638,728, which is a continuation of International Application Serial No. PCT/US04/030326, filed Sep. 16, 2004, published Mar. 31, 2005, which claims priority from U.S. Provisional Application Ser. No. 60/503,437, filed Sep. 16, 2003, each of which are incorporated by reference in their entireties herein, and from which priority is claimed.

FIELD OF THE INVENTION

The present invention relates to semiconductor processing techniques, and more particularly, techniques for fabricating semiconductors suitable for use as thin-film transistor ("TFT") devices.

BACKGROUND INFORMATION

During the past several years, sequential lateral solidification ("SLS") techniques have been developed to generate quality large grained polycrystalline thin films, e.g., silicon films, having a substantially uniform grain structure. For example, in U.S. Pat. No. 6,322,625, issued to Im and U.S. patent application Ser. No. 09/390,537 (the "'537 application"), the entire disclosures of which are incorporated herein by reference, particularly advantageous apparatus and methods for growing large grained polycrystalline or single crystal silicon structures using energy-controllable laser pulses and small-scale translation of a silicon sample to implement sequential lateral solidification have been described. As described in these patent documents, at least portions of the semiconductor film on a substrate are irradiated with a suitable radiation pulse to completely melt such portions of the film throughout their thickness.

In order to increase throughput, continuous motion SLS processes have been proposed. Referring to FIG. 1, such system preferably includes an excimer laser 110, an energy density modulator 120 to rapidly change the energy density of a laser beam 111, a beam attenuator and shutter 130, optics 140, 141, 142 and 143, a beam homogenizer 144, a lens and beam steering system 145, 148, a masking system 150, another lens and beam steering system 161, 162, 163, an incident laser pulse 164, a thin film sample on a substrate 170 (e.g., a silicon thin film) a sample translation stage 180, a granite block 190, a support system 191, 192, 193, 194, 195, 196, and a computer 100 which manages X and Y direction translations and microtranslations of the film sample and substrate 170. The computer 100 directs such translations and/or microtranslations by either a movement of a mask within masking system 150 or by a movement of the sample translation stage 180. As described in U.S. Pat. No. 6,555,449 issued to Im, the entire disclosure of which is incorporated herein by reference, the sample 170 may be translated with respect to the laser beam 149, either by moving the masking system 150 or the sample translation stage 180, in order to grow crystal regions in the sample 170.

FIG. 2 depicts the mask used in the continuous motion SLS process as described in International Publication No. 02/086954 (the "'954 Publication"), the entire disclosure of which is incorporated herein by reference. This mask is divided into a first mask section 20 and a second mask section 22. The first mask section 20 can be used for the first pass under the laser. The second mask section 22 is used on the second pass. The first mask section 20 may have corresponding opaque areas 24 and clear areas 25. Throughout the specification of the '954 Publication and the present application, "opaque areas" are referred to as areas of the mask that prevent associated regions of a thin film sample irradiated by beams passed through the mask from being completely melted throughout its thickness, while "clear areas" are areas of the mask that permit associated regions of a thin film sample irradiated by beams passed through the mask to be completely melted throughout its thickness. The clear areas can be actual holes in the mask or may be sections of the mask that allow the sample behind it to be completely melted throughout its thickness. The second mask section 22 also has corresponding opaque areas 26 and clear areas 27. The opaque areas 24, 26 of both sections 20, 22 are areas that prevent radiation from a laser source from passing through to the sample. The shape of these clear areas, both in the second mask section 22 and in the first mask section 20, generally have a shape of "straight slits." The array of the clear areas 24 in the first mask section 20 are generally staggered from the array of clear areas 26 in the second mask section 22. As indicated above, the clear areas 25, 27 of both sections allows radiation to pass through to melt the sample below the surface of the mask.

FIG. 3 depicts the radiation pattern passing through the mask of FIG. 2 during processing of the film. The first pattern section 30 shows the pattern that results after the first pass of the irradiation by the pulses shaped using the mask. The pulse passing through the mask may have a first portion 34 that corresponds to the pattern of the first mask section 20. The clear areas of the first mask section 20 in FIG. 2 allow the radiation to pass therethrough, and melt the thin film throughout its thickness, thus resulting in a first melted region and an unmelted region 44 (see FIG. 4) after the first pass of the sample processing. When the mask is translated in the direction of the arrow 33, the second pattern section 32 of FIG. 3 with the radiation pattern results after the second pass of processing the sample. The pulse passing through the mask may have a second portion 36 that corresponds to the pattern of the second mask section 22. The clear areas of the second mask section 22 of the mask in FIG. 2 allow the radiation to pass therethrough, and again melt the thin film throughout its thickness. This results in a second melted region and an unmelted region over the grain boundary 45 (see FIG. 4).

FIG. 4 depicts the resulting crystalline structure that is produced using the mask of FIG. 2. The first structure section 40 includes the structure 41 that results after the first pass of the sample processing. The opaque areas of the first mask section 20 of the mask of FIG. 2 prevent the associated regions 44 from completely melting. A grain boundary 45 in the direction of the crystalline structure forms approximately halfway between the associated regions 44. The second structure section 42 includes the crystalline structure 48 that results after the second pass of the sample processing. The grain boundary 45 from the first pass is not removed, while the individual grains expand in length until they meet one another, because all areas are exposed to the laser during the second pass except the area that corresponds to the grain boundary 45. Thus, the grain length 46 (parallel to the direction of the crystalline structure) may be controlled by the properties and slit patterns of the mask of FIG. 2. The width 47 of the grain (perpendicular to the direction of the crystalline structure), however, is not very easily controlled. Indeed, it may be primarily dependent on the characteristics of the film.

As noted above, the aforementioned SLS techniques typically employ a straight slit mask pattern. This allows for the ease of control of the grain length (in the direction of the primary crystallization). In such case, the perpendicular grain spacing may be dependent on the properties of the film, and thus is not very easily manipulated. While the tailoring of the shaped areas to manipulate the microstructure has been employed in other SLS methods and systems, such as with the use of chevron-shaped openings in a mask, the techniques associated therewith may produce narrow grain areas. Accordingly, there is a need to control grain length in the thin film, as well as increase the area in which a smaller number of grains are present.

SUMMARY OF THE INVENTION

The present invention overcomes the above-mentioned problems by providing a mask having a row of point-type areas (e.g., diamond and/or dot patterned opaque regions) provided thereon. Such mask pattern that uses closely spaced circular or diamond-shaped areas is utilized in lieu of the straight slits in at least a portion of the mask in order to produce a microstructure with wider grain areas. Using the mask of this configuration according to the present invention advantageously affects a melt interface curvature on the evolution of grain boundaries to favorably increase the perpendicular grain boundary spacing.

According to one exemplary embodiment of the present invention, a masking arrangement, system and process are provided for processing a thin film sample, e.g., an amorphous silicon thin film, into a polycrystalline thin film. In particular, a mask can be utilized which includes a first section having at least one opaque areas arranged in a first pattern, e.g., diamond areas, oval areas, and/or round areas. The first section may be configured to receive a beam pulse thereon, and produce a first modified pulse when the beam pulse is passed therethrough. The first modified pulse may include at least one first portion having a pattern that corresponds to the first pattern of the first section. When the first portion is irradiated on the sample, at least one first region of the sample is prevented from being completely melted throughout its thickness. The mask may also includes a second section associated with the first section, with the second section including a further area arranged in a second pattern. The second section may be configured to receive a further beam pulse thereon, and produce a second modified pulse when the further beam pulse is passed therethrough. The second modified pulse can include at least one second portion having a pattern that corresponds to the second pattern of the second section. When the second portion is irradiated on the sample, at least one second region of the sample irradiated by the second portion is completely melted throughout its thickness. In addition, when the first region is irradiated by the second modified pulse, the second portion of the second modified pulse completely melts the first region throughout its thickness.

The accompanying drawings, which are incorporated and constitute part of this disclosure, illustrate preferred embodiments of the invention and serve to explain the principles of the invention.

Figure 1:
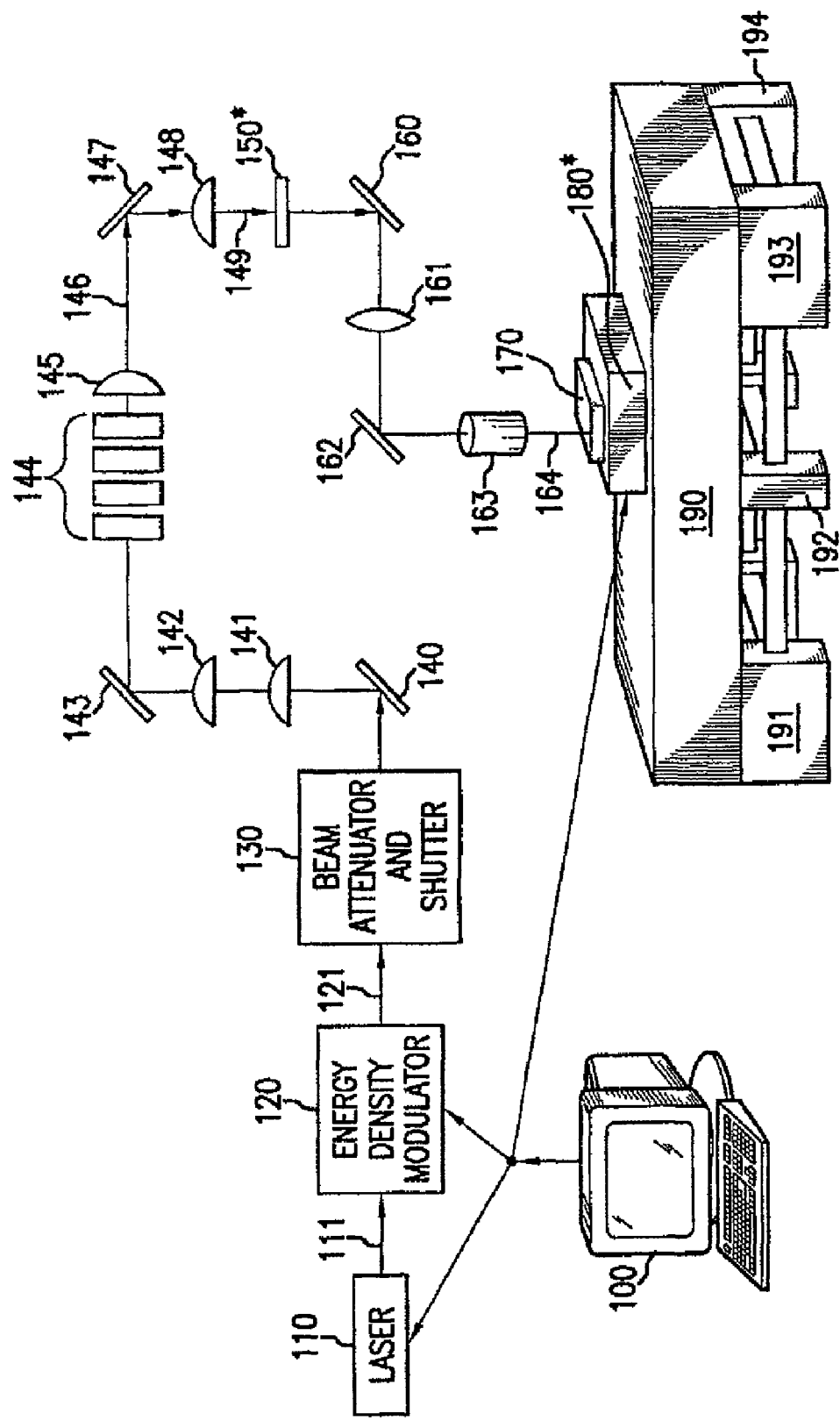
FIG. 1 is a functional diagram of a conventional system for performing semiconductor processing including sequential lateral solidification of a thin film.

Throughout the FIGS., the same reference numerals and characters, unless otherwise stated, are used to denote like features, elements, components or portions of the illustrated embodiments. Moreover, while the present invention will now be described in detail with reference to the FIGS., it is done so in connection with the illustrative embodiments.

DETAILED DESCRIPTION OF THE PREFERRED EMBODIMENTS

Figure 5:
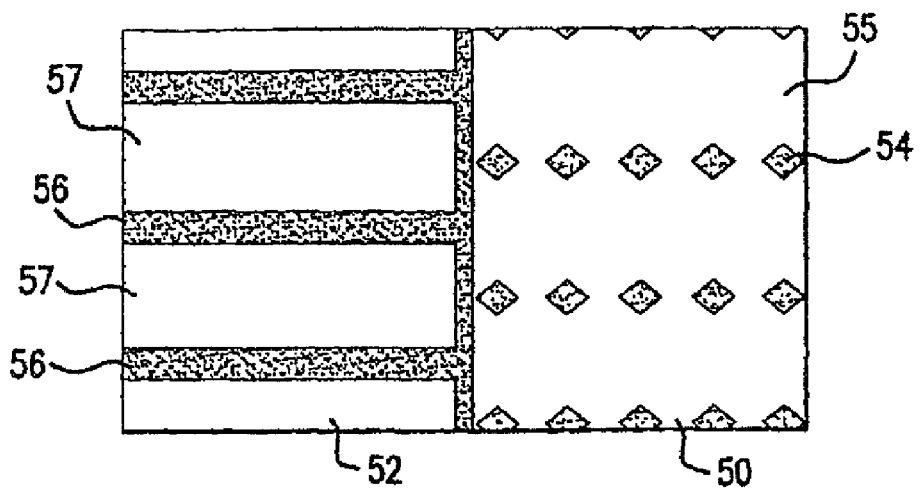
FIG. 5 is a top view of a mask according to an exemplary embodiment according to the present invention.
Figure 6:
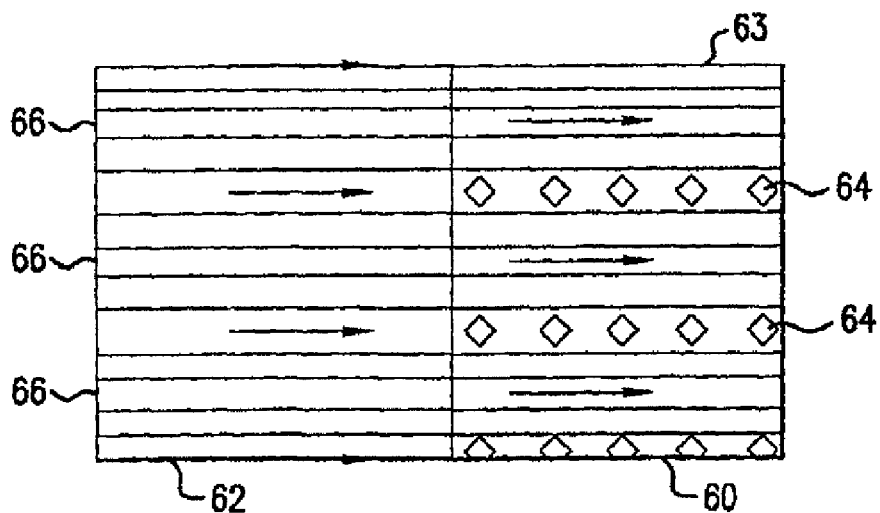
FIG. 6 is a top view of an irradiation pattern generated by the mask of FIG. 5.
Figure 7:
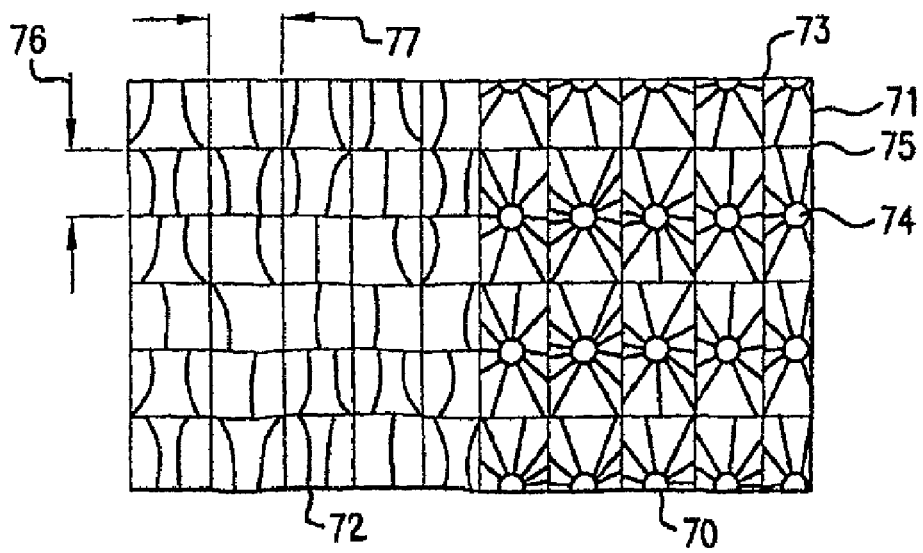
FIG. 7 is a top view of a grain spacing produced by the mask of FIG. 5.

Referring to FIGS. 5-7, a presently preferred embodiment of the present invention will be described. This embodiment utilizes an exemplary mask pattern according to the present invention which uses preferably closely spaced circular or diamond-shaped areas in order to produce a microstructure with wider areas of limited number of grains provided therein. Those skilled in the art should understand that the systems, methods, and masks according to the present invention are applicable not only to single-shot motion SLS processes and systems, but also to thin films that have been processed with n-shot and 2n-shot SLS techniques.

Figure 2:
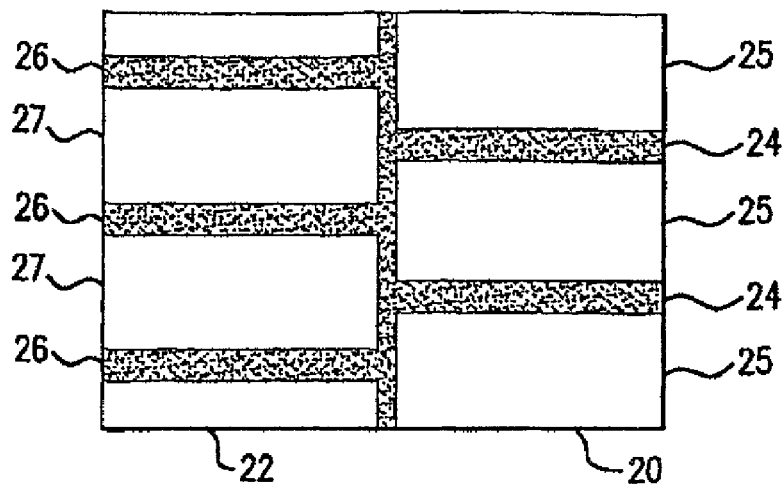
FIG. 2 is a top view of a conventional mask.
Figure 3:
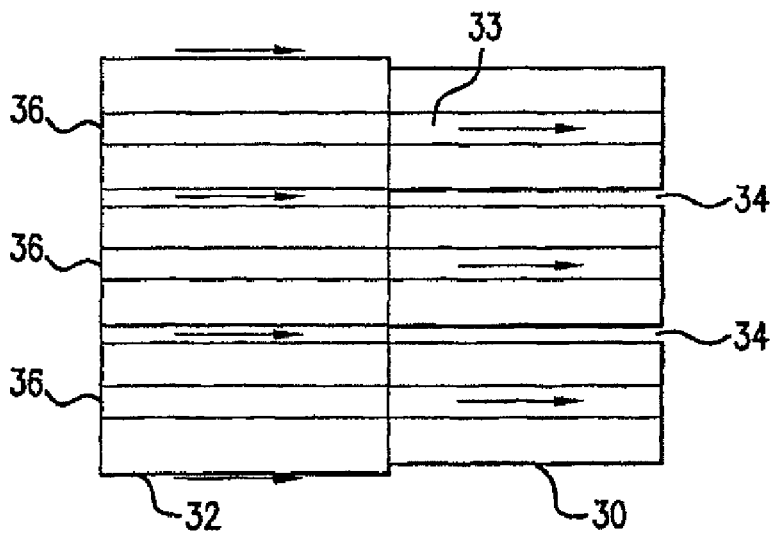
FIG. 3 is a schematic top view showing the radiation pattern associated with the mask of FIG. 2.
Figure 4:
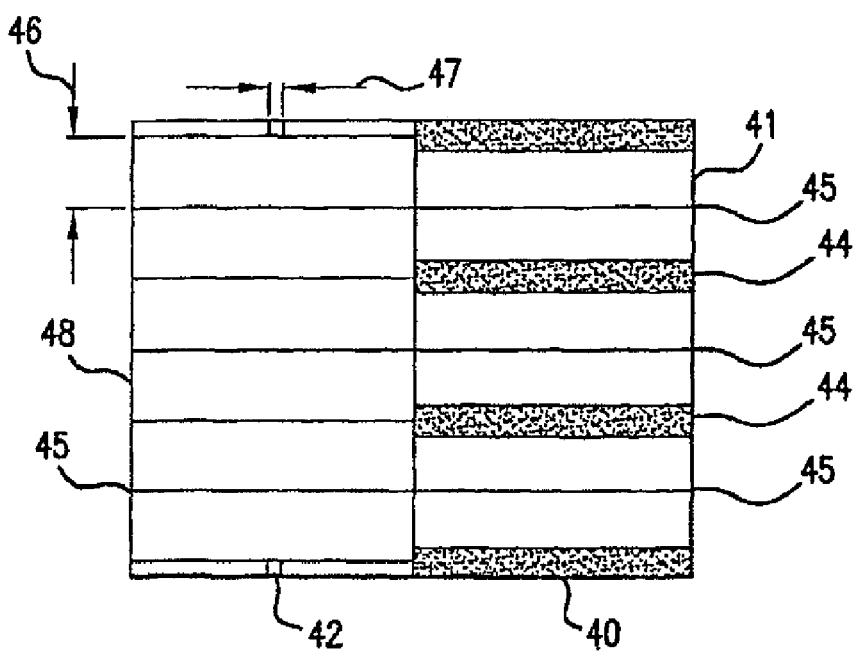
FIG. 4 is a schematic top view showing grain spacing in the processed thin film that results from use of the mask of FIG. 2.

Referring to FIG. 5, the mask which may be used in an exemplary embodiment of the present invention may be divided into a first mask section 50 and a second mask section 52. Alternatively, two separate masks may be used instead of separate sections in one mask. The first mask section 50 may be used to process a selected area of the thin film as an initial shot. The second mask section 52 may be used as a second shot which immediately follows the first shot. The first mask section 50 may have corresponding opaque areas 54 and clear areas 55. The second mask section 52 may also have corresponding opaque areas 56 and clear areas 57. While the shape of these opaque areas in the second mask section 52 may be in the shape of traditional "straight slits" as described herein above in FIGS. 2-4, the opaque areas in the first mask section 50 are preferably provided in rows of diamonds, circular shaped, and/or oval shaped areas. The array of opaque areas 54 in the first mask section may be staggered from the array of opaque areas 56 in the second mask section.

FIG. 6 depicts the radiation pattern that may be shaped by the mask of FIG. 5 upon passing a beam pulse therethrough. In particular, the first pattern section 60 includes the pattern that may result upon the first shaped pulse impacting the corresponding portions on the sample. A pulse shaped by the mask may have a first portion 64 that corresponds to the pattern of the first mask section 50. The opaque mask areas 54 of the first mask section 50 in FIG. 5 may block the radiation from passing through to the thin film sample, and thus result in a first unmelted region 74 in the first pass (see FIG. 7). As shown in FIG. 7, the grains grow outwardly from the unirradiated areas because they seed the melted regions upon the resolidification of the melted areas. Thus, the width of the resolidified regions is based on the grain growth into two opposite directions. This is because the grains grow outward from the unmelted regions, e.g., in the opposite directions thereof. Parallel grain boundaries 75, as shown in FIG. 7, are foamed when the grain growth from neighboring regions produced by the pattern of the first mask section 50 impact one another. In this manner, approximately horizontal borders between resolidified regions may be formed. When the mask is shifted in the direction of the arrow 63, the beam is translated and/or the sample may be translated in the opposite direction of the arrow 63 by the translation stage, the second pattern section 62 of FIG. 6 shows the radiation pattern that may result after the second shot irradiates the corresponding portions of the thin film. In particular, a pulse passing through the mask may have a second portion 66 that corresponds to the pattern of the second mask section 52. The opaque areas 56 of the second mask section 52 of the mask in FIG. 5 may prevent the sample irradiated by pulses that are shaped by the mask from being completely melted throughout its thickness. This may result in a generation of second melted region, and an unmelted region which is provided over the unmelted grain boundary 75 (see FIG. 7).

FIG. 7 depicts the resulting crystalline structure that may develop using the mask of FIG. 5. The first structure section 70 includes a structure 71 that may be produced after irradiation thereof by the first beam pulse. The opaque areas of the first section of the mask of FIG. 5 prevent the associated regions 74 from completely melting. A parallel grain boundary 75 as well as a perpendicular grain boundary 73 may be formed approximately halfway between the associated regions 74. The second structure section 72 includes a crystalline structure that may be formed after the irradiation by the second beam pulse. The crystal grained structures in this section 72 may grow radially outward from the associated regions 74. The parallel grain boundary 75 as well as the perpendicular grain boundary 73 produced by the irradiation with the first pulse may remain in tact while the sample is exposed to the second beam pulse shaped by the second section 52 of the mask. Thus, the grain length 76 (parallel to the direction of the crystalline structure) as well as the grain width 77 (perpendicular to the direction of the crystalline structure) may be controllable by the properties of the mask (e.g. pattern), rather than merely being dependent on the characteristics of the film. The grain width 77 formed using the embodiment of the mask according to the present invention may be wider than the grain width 47 formed with a straight slit mask pattern, and can be controlled using the mask pattern.

Figure 8:
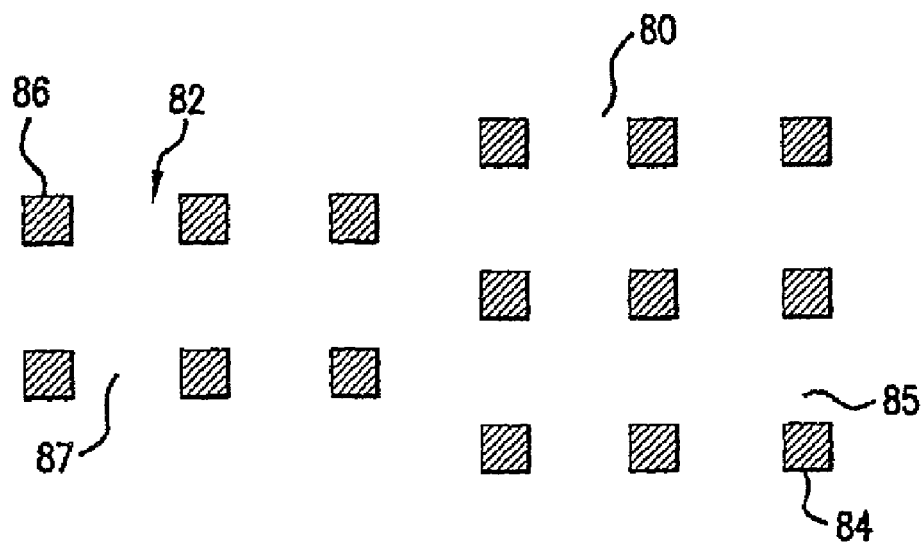
FIG. 8 is a top view of a mask according to an exemplary embodiment according to the present invention.

Referring to FIG. 8, a mask that may be used in an exemplary embodiment of the present invention may be divided into a first mask section 80 and a second mask section 82. Alternatively, two separate masks may be used instead of separate sections in one mask. The first mask section 80 may be used to process a selected area of the thin film as an initial shot. The second mask section 82 may be used as a second shot which immediately follows the first shot. The first mask section 80 may have corresponding opaque areas 84 and clear areas 85. The second mask section 82 may also have corresponding opaque areas 86 and clear areas 87. While the shape of the opaque areas may be in both the first and second mask section may be any shape as described herein above in FIGS. 2-4. The opaque areas in the first mask section 85 are preferably provided in rows of diamonds, circular shaped, dot shaped and/or oval shaped areas. In one exemplary embodiment, as shown in FIG. 8, the opaque areas of both the first and second mask sections are dots. Optionally, the array of opaque areas 84 in the first mask section may be staggered from the array of opaque areas 86 in the second mask section.

Figure 9:
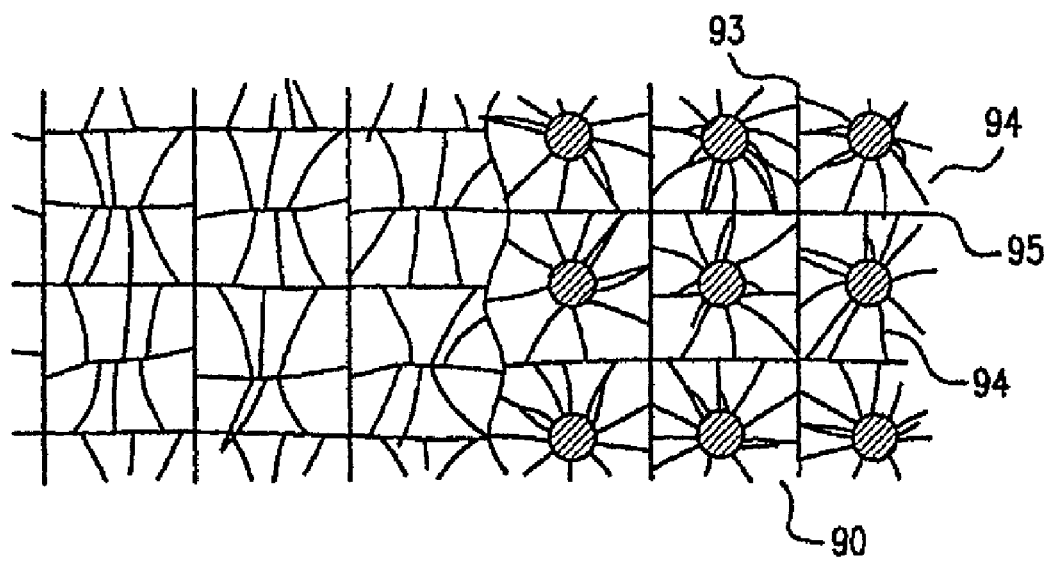
FIG. 9 is a top view of a grain spacing produced by the mask of FIG. 8.

FIG. 9 depicts the resulting crystalline structure that may develop using the mask of FIG. 8. The first structure section 90 includes a structure 91 that may be produced after irradiation thereof by the first beam pulse. The opaque areas of the first section of the mask of FIG. 8 prevent the associated regions 94 from completely melting. A parallel grain boundary 95 as well as a perpendicular grain boundary 93 may be formed approximately halfway between the associated regions 94. crostructures. In one exemplary embodiment, the opaque areas of the second section 86 may be located on the edge of two islands grown from regions produced by the first pulse. In another exemplary embodiment, the opaque areas of the second section 86 may be located on the corner of four islands grown from opaque areas of the first region 84.

Figure 10:
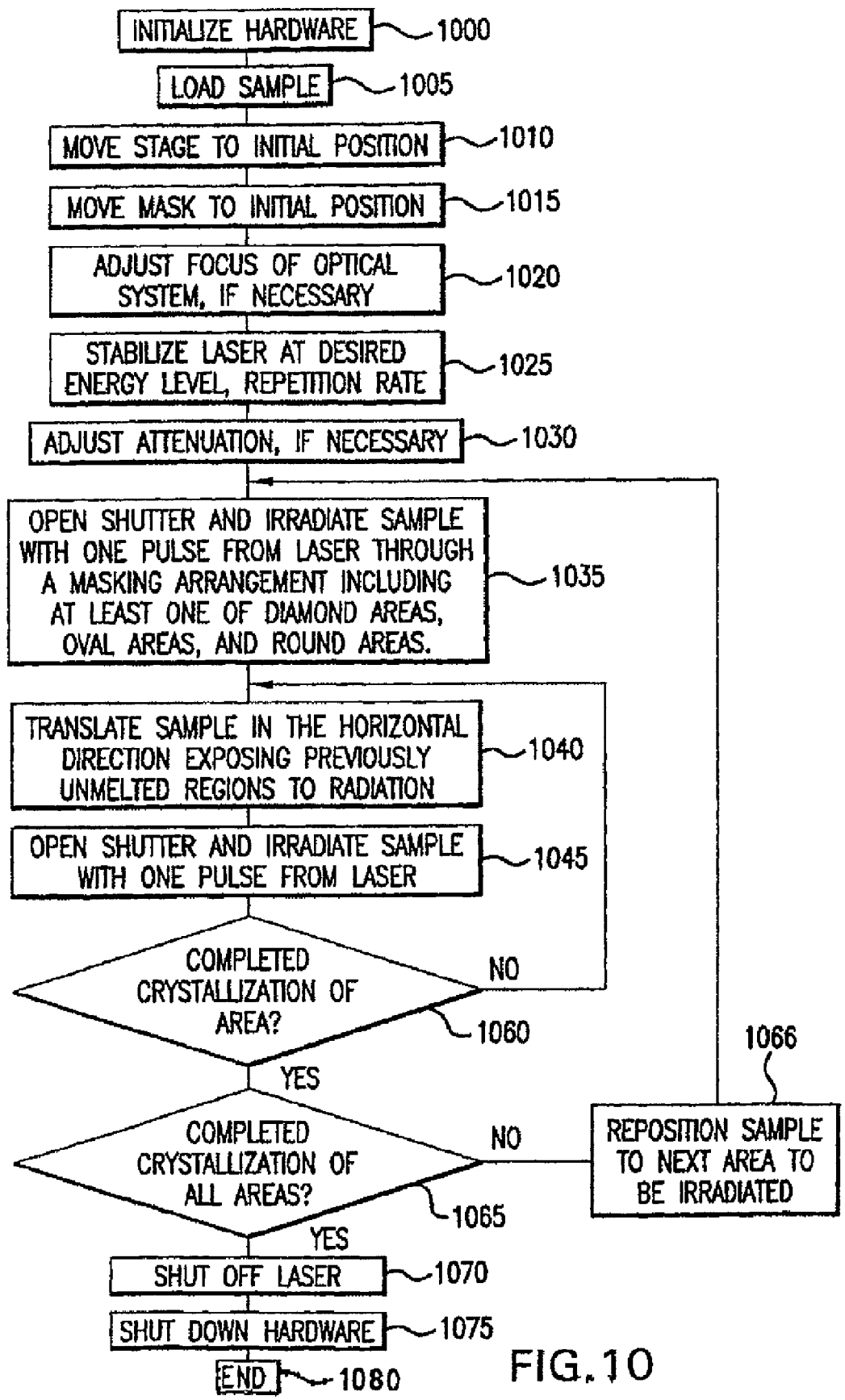
FIG. 10 is a flow diagram illustrating the steps according to the present invention implemented by the system of FIG. 1.

Referring next to FIG. 10, the steps executed by a computer to control the crystal growth process implemented with respect to FIG. 7 will be described. FIG. 8 is a flow diagram illustrating the basic steps implemented in the system of FIG. 1. The various electronics of the system shown in FIG. 1 may be initialized 1000 by the computer to initiate the process. A thin film sample, e.g., a silicon thin film, may then be loaded onto the sample translation stage 1005. It should be noted that such loading may be either manual or robotically implemented under the control of computer 100. Next, the sample translation stage may be moved into an initial position 1015, which may include an alignment with respect to reference features on the sample. The various optical components of the system may be focused 1020 if necessary. The laser may then be stabilized 1025 to a desired energy level and repetition rate, as needed to fully melt the sample in accordance with the particular processing to be carried out. If necessary, the attenuation of the laser pulses may be finely adjusted 1030.

Next, the shutter may be opened 1035 to expose the sample to a single pulse of irradiation through a masking arrangement including at least one of diamond shaped areas, oval shaped areas, and round shaped areas, and accordingly, to commence the sequential lateral solidification process. The sample may be translated in the horizontal direction 1040. The shutter is again opened 1045 exposing previously unmelted regions to a single pulse of irradiation. The process of sample translation and irradiation 1040, 1045 may be repeated 1060 to grow the polycrystalline region.

Next, if other regions on the sample have been designated for crystallization, the sample is repositioned 1065, 1066 and the crystallization process is repeated on the new region. If no further regions have been designated for crystallization, the laser is shut off 1070, the hardware is shut down 1075, and the process is completed 1080. Of course, if processing of additional samples is desired or if the present invention is utilized for batch processing, steps 1005, 1010, and 1035-1065 can be repeated on each sample.

The foregoing merely illustrates the principles of the invention. Various modifications and alterations to the described embodiments will be apparent to those skilled in the art in view of the teachings herein. It will thus be appreciated that those skilled in the art will be able to devise numerous systems and methods which, although not explicitly shown or described herein, embody the principles of the invention and are thus within the spirit and scope of the invention.

The invention claimed is:
1. A masking arrangement for processing a thin film sample comprising:

a first section which includes at least one opaque area arranged in a first pattern, the first section is configured to receive at least one beam pulse thereon, and produce at least one first modified pulse when the at least one beam pulse is passed therethrough, the at least one first modified pulse including at least one first portion having a pattern that corresponds to the first pattern of the first section, wherein, when the first portion is irradiated on the sample, at least one first region of the sample is prevented from being completely melted throughout its thickness; and a second section associated with the first section, the second section including a further area arranged in a second pattern, the second section being configured to receive at least one further beam pulse thereon, and produce at least one second modified pulse when the at least one further beam pulse is passed therethrough, the at least one second modified pulse including at least one second portion having a pattern that corresponds to the second pattern of the second section, wherein, when the second portion is irradiated on the sample, at least one second region of the sample irradiated by the second portion is completely melted throughout its thickness, wherein when the first region is irradiated by the at least one second modified pulse, the second portion of the at least one second modified pulse completely melts the at least one first region throughout its thickness.

2. The masking arrangement as in claim 1, wherein at least one of the first pattern and the second pattern comprises at least one of diamond areas, oval areas, dot areas and round areas.

3. The masking arrangement as in claim 1, wherein,
the first pattern extends approximately along a first horizontal axis, the first pattern having a width measured along the vertical axis,
a second area of the second section extends approximately along the first horizontal axis, the second section being configured to permit the at least one first region to be completely melted throughout its thickness by the second modified pulse, the second area being offset horizontally from the first pattern, the second area having a width measured in the vertical axis that is at least equal to the width of the first pattern, and
the second pattern extends approximately along a second horizontal axis and vertically offset from the first horizontal axis, wherein the second pattern is configured to prevent at least one third region of the sample from being completely melted throughout its thickness.

4. A masking arrangement as in claim 3, wherein the first section includes
at least one further opaque area arranged in a third pattern extending approximately along a third horizontal axis,
wherein the third horizontal axis is vertically offset from the first horizontal axis,
wherein the third pattern is substantially aligned vertically with the first pattern,
wherein the third pattern is configured to prevent at least one fourth region of the sample from being completely melted throughout its thickness,
wherein a position of the third horizontal axis is such that the second horizontal axis is between the first horizontal axis and the third horizontal axis.

5. The masking arrangement as in claim 4, wherein the third pattern comprises at least one of diamond areas, oval areas, dot areas and round areas.

6. The masking arrangement of claim 3, wherein the second horizontal axis extends approximately along a centerline in between the first and third horizontal axes.

7. The masking arrangement of claim 4, wherein,
elements of the first pattern are approximately equidistant from other elements of the first pattern, and
elements of the third pattern are approximately equidistant from other elements of the third pattern.

8. The mask arrangement of claim 1, wherein the second pattern comprises one or more substantially parallel lines.

9. A method for processing a thin film sample, comprising the steps of:
providing at least one beam on a first section of a masking arrangement to produce at least one first modified pulse when the at least one beam is passed therethrough, the first section which includes at least one opaque area arranged in a first pattern, the at least one first modified pulse including at least one first portion having a pattern that corresponds to the first pattern, wherein, when the first portion is irradiated on the sample, at least one first region of the sample is prevented from being completely melted throughout its thickness;
based on the dimensions of the masking arrangement, translating at least one of the thin film sample and the beam relative to the other one of the thin film sample and the beam; and
providing at least one further beam on a second section of a masking arrangement to produce at least one second modified pulse when the at least one further beam is passed therethrough, the second section associated with the first section, the second section including a further area arranged in a second pattern, the at least one second modified pulse including at least one second portion having a pattern that corresponds to the second pattern, wherein, when the second portion is irradiated on the sample, at least one second region of the sample irradiated by the second portion is completely melted throughout its thickness; wherein, when the first region is irradiated by the at least one second modified pulse, the second portion of the at least one second modified pulse completely melts the at least one first region throughout its thickness.

10. The method of claim 9, wherein at least one of the first pattern and the second pattern comprises at least one of diamond areas, oval areas, dot areas and round areas.

11. The method of claim 9, wherein,
the first pattern extends approximately along a first horizontal axis, the first pattern having a width measured along the vertical axis,
a second area of the second section extends approximately along the first horizontal axis, the second section being configured to permit the at least one first region to be completely melted throughout its thickness by the at least one second modified pulse, the second area being offset horizontally from the first pattern, the second area having a width measured in the vertical axis that is at least equal to the width of the first pattern, and
the second pattern extends approximately along a second horizontal axis and vertically offset from the first horizontal axis, wherein the second pattern is configured to prevent at least one third region of the sample from being completely melted throughout its thickness.

12. The method of claim 11, wherein the first section includes
at least one further opaque area in a third pattern extending approximately along a third horizontal axis, wherein the third horizontal axis is vertically offset from the first horizontal axis, wherein the third pattern is substantially aligned vertically with the first pattern, wherein the third pattern is configured to prevent at least one fourth region of the sample from being completely melted throughout its thickness, wherein a position of the third horizontal axis is such that the second horizontal axis is between the first horizontal axis and the third horizontal axis.

13. The method of claim 12, wherein the third pattern comprises at least one of diamond areas, oval areas, dot areas and round areas.

14. The method of claim 11, wherein the second horizontal axis is approximately along a centerline in between the first and third horizontal axes.

15. The method of claim 12, wherein,
elements of the first pattern are approximately equidistant from other elements of the first pattern, and
elements of the third pattern are approximately equidistant from other elements of the third pattern.

16. The method of claim 9, wherein the second pattern comprises one or more substantially parallel lines.

17. A system for processing a thin film sample, comprising:
a mask,
a processor to activate a device to irradiate through the mask, the processor being configured to perform the steps of:
providing at least one beam on a first section of a masking arrangement to produce at least one first modified pulse when the at least one beam is passed therethrough, the first section which includes at least one opaque area arranged in a first pattern, the at least one first modified pulse including at least one first portion having a pattern that corresponds to the first pattern, wherein, when the first portion is irradiated on the sample, at least one first region of the sample is prevented from being completely melted throughout its thickness, based on the dimensions of the masking arrangement, translating at least one of the thin film sample and the beam relative to the other one of the thin film sample and the beam, and providing at least one further beam on a second section of a masking arrangement to produce at least one second modified pulse when the at least one further beam is passed therethrough, the second section associated with the first section, the second section including a further area arranged in a second pattern, the at least one second modified pulse including at least one second portion having a pattern that corresponds to the second pattern, wherein, when the second portion is irradiated on the sample, at least one second region of the sample irradiated by the second portion is completely melted throughout its thickness; wherein, when the first region is irradiated by the at least one second modified pulse, the second portion of the at least one second modified pulse completely melts the at least one first region throughout its thickness.

18. The system of claim 17, wherein at least one of the first pattern and the second pattern comprises at least one of diamond areas, oval areas, dot areas and round areas.

19. The system of claim 17, wherein,
the first pattern extends approximately along a first horizontal axis, the first pattern having a width measured along the vertical axis,
a second area of the second section extends approximately along the first horizontal axis, the second section being configured to permit the at least one first region to be completely melted throughout its thickness by the at least one second modified pulse, the second area being offset horizontally from the first pattern, the second area having a width measured in the vertical axis that is at least equal to the width of the first pattern, and
the second pattern extends approximately along a second horizontal axis and vertically offset from the first horizontal axis, wherein the second pattern is configured to prevent at least one third region of the sample from being completely melted throughout its thickness.

20. The system of claim 19, wherein the first section includes
at least one further opaque area extending in a third pattern approximately along a third horizontal axis,
wherein the third horizontal axis is vertically offset from the first horizontal axis,
wherein the third pattern is substantially aligned vertically with the first pattern,
wherein the third pattern is configured to prevent at least one fourth region of the sample from being completely melted throughout its thickness,
wherein a position of the third horizontal axis is such that the second horizontal axis is between the first horizontal axis and the third horizontal axis.

21. The system of claim 20, wherein the third pattern comprises at least one of diamond areas, oval areas, dot areas and round areas.

22. The system of claim 20, wherein the second horizontal axis is approximately along a centerline in between the first and third horizontal axes.

23. The system of claim 22, wherein,
elements of the first pattern are approximately equidistant from other elements of the first pattern, and
elements of the third pattern are approximately equidistant from other elements of the third pattern.

24. The system of claim 19, wherein the second pattern comprises one or more substantially parallel lines.

\* \* \* \* \*